US008002603B2

(12) United States Patent
Yang et al.

(10) Patent No.: US 8,002,603 B2
(45) Date of Patent: Aug. 23, 2011

(54) CO-PROCESSABLE PHOTOIMAGEABLE SILVER AND CORBON NANOTUBE COMPOSITIONS AND METHOD FOR FIELD EMISSION DEVICES

(75) Inventors: Haixin Yang, Chapel Hill, NC (US); Lap-Tak Andrew Cheng, Newark, DE (US); Terry Roland Suess, Raleigh, NC (US); Chien Lung Weng, Taoyuan (TW)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 12/468,093

(22) Filed: May 19, 2009

(65) Prior Publication Data

US 2009/0284122 A1 Nov. 19, 2009

Related U.S. Application Data

(60) Provisional application No. 61/128,177, filed on May 19, 2008.

(51) Int. Cl.
*H01J 9/00* (2006.01)

(52) U.S. Cl. .......................................... 445/50; 313/495

(58) Field of Classification Search .................. 313/311, 313/310, 346; 445/49–51
See application file for complete search history.

(56) References Cited

U.S. PATENT DOCUMENTS

| | | | |
|---|---|---|---|
| 2,760,863 | A | 8/1956 | Plambeck, Jr. |
| 2,850,445 | A | 9/1958 | Oster |
| 2,875,047 | A | 2/1959 | Oster |
| 2,927,022 | A | 3/1960 | Martin et al. |
| 3,074,974 | A | 1/1963 | Gebura |
| 3,097,096 | A | 7/1963 | Oster |
| 3,097,097 | A | 7/1963 | Oster et al. |
| 3,145,104 | A | 8/1964 | Oster et al. |
| 3,380,831 | A | 4/1968 | Cohen et al. |
| 3,427,161 | A | 2/1969 | Laridon et al. |
| 3,479,185 | A | 11/1969 | Chambers, Jr. |
| 3,549,367 | A | 12/1970 | Chang et al. |
| 4,162,162 | A | 7/1979 | Dueber |
| 5,049,480 | A | 9/1991 | Nebe et al. |
| 7,135,267 | B2 | 11/2006 | Yang et al. |
| 7,276,844 | B2 | 10/2007 | Bouchard et al. |
| 2002/0074932 | A1 | 6/2002 | Bouchard et al. |
| 2005/0231091 | A1 | 10/2005 | Bouchard et al. |
| 2006/0049737 | A1 | 3/2006 | Hsiao et al. |
| 2007/0161133 | A1 | 7/2007 | Liao et al. |

OTHER PUBLICATIONS

International Search Report for International Application No. PCT/US2009/044430 Dated Dec. 10, 2009.

*Primary Examiner* — Joseph L Williams

(57) ABSTRACT

Described herein are methods of manufacturing an electrode and emitter in a field emission device, and devices formed from the methods. Compositions useful for the manufacture of an electrode and emitter in a field emission device are also described.

13 Claims, 4 Drawing Sheets

2

4

2

FIG. 1A
2
FIG. 1B
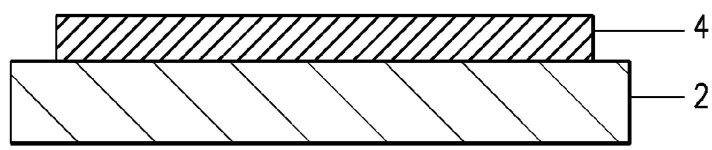
FIG. 1C
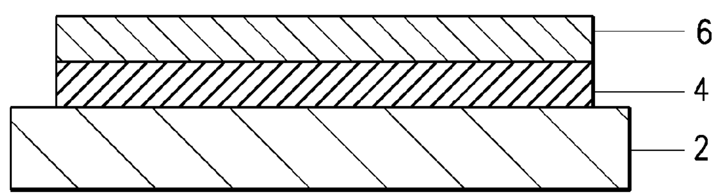
FIG. 1D
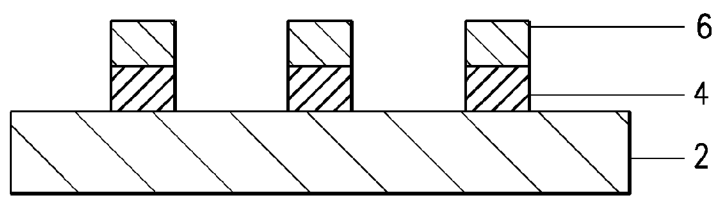
FIG. 1E
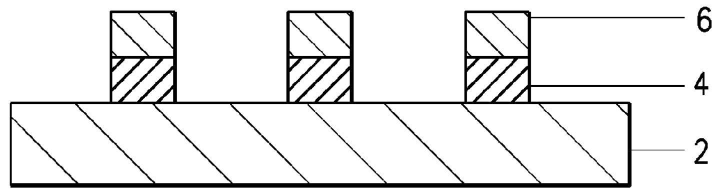

CO-PROCESSABLE PHOTOIMAGEABLE SILVER AND CORBON NANOTUBE COMPOSITIONS AND METHOD FOR FIELD EMISSION DEVICES

FIELD OF THE INVENTION

The invention concerns novel photoimageable silver and carbon nanotube (CNT) paste compositions and processing methods, which can be co-processed, for improving the manufacture of cathode electrodes and emitters of field emission devices. The compositions and method are useful in FED television and backlighting applications.

TECHNICAL BACKGROUND OF INVENTION

Field emission electron sources, often referred to as field emission materials or field emitters, can be used in a variety of electronic applications, e.g., vacuum electronic devices, flat panel computer and television displays, emission gate amplifiers, and back-lighting.

There is a continuing need for improved technology enabling the use of acicular carbon (e.g. carbon nanotubes) in electron field emitters. In the process, conductor electrodes and emitters formed by a separate imaging, development and firing steps. If the electrode is made of ITO, ITO is sputtered via a mask pattern in vacuum. If the electrode is made of silver, a photoimageable silver thick film paste, such as Fodel® from DuPont, is first screen-printed, dried, photoimaged, developed, and fired. Then a CNT emitter paste is printed on top of conductor electrodes, dried, imaged, developed and fired.

There is a need to minimize the number of process steps and improve the process. The present invention addresses this need.

SUMMARY OF THE INVENTION

The present invention is directed to a novel co-processing method for formation of FED cathode electrode and emitter, and a co-processable photoimageable silver composition and a CNT composition for the processing method.

The invention comprises: a CNT composition for use as a screen printable paste containing solids comprising carbon nanotubes, wherein the carbon nanotubes are less than 9 wt % of the total weight of solids in the paste. In an embodiment, the carbon nanotubes are less than 5 wt % of the total weight of solids in the paste. In a further embodiment, the carbon nanotubes are less than 1 wt % of the total weight of solids in the paste. In a further embodiment, the carbon nanotubes are about 0.01 wt % to about 2 wt % of the total weight of solids in the paste. In an embodiment. the composition may also include metal resinates, from 0.1% to 6.5%; in a further embodiment, 1.5-4%. In an embodiment, this composition is useful in fabricating an electron field emitter which then undergoes the novel process of the invention. Such an emitter has excellent emitter uniformity and emission properties along with the advantages of ease of preparing and improved processing conditions.

The invention also comprises: a silver composition for use as a photoimageable paste containing solids comprising silver metal powder, wherein the silver metal powder are from 10-80 wt % of the total weight of solids in the paste. In an embodiment, the silver metal powders are between 40-70 wt % of the total weight of solids in the paste. In an embodiment, the silver metal powders are about 60 wt % to about 68 wt % of the total weight of solids in the paste. The silver composition can be photo-imaged and developed by basic aqueous solutions to form fine lines. This composition is especially useful in fabricating a FED cathode electrode which then undergoes the novel process of the invention. Metal powders are not limited to silver. One or more other metals, such as Au, Ni, Al, Cu and Pd, may be used instead of silver, alone, in combination, in combination with silver, or in combination with one or more other metals.

The invention also comprises: a method of co-processing the CNT and silver compositions to form a FED cathode electrode and electron emitters.

The compositions and methods disclosed herein are useful, for example, in flat panel computer, television and other types of displays, vacuum electronic devices, emission gate amplifiers, klystrons and in lighting devices. The process is especially advantageous for producing large area electron field emitters for flat panel displays, i.e., for displays greater than 30 inches (76 cm) in size. The flat panel displays can be planar or curved.

BRIEF DESCRIPTION OF THE DRAWINGS

FIG. 1 is an illustration of the invented co-processing method to form silver cathode electrode and CNT emitter by co-imaging, co-development, and co-firing.

DETAILED DESCRIPTION OF THE INVENTION

Figure 2A:
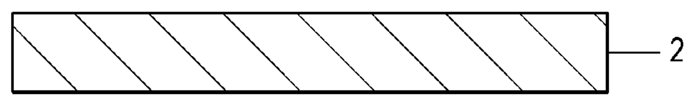
FIG. 2 is an illustration of the invented co-processing method to form silver cathode electrode and CNT emitter by separate-imaging, co-development, and co-firing.
Figure 2B:
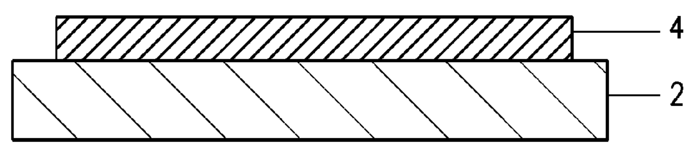
Figure 2C:
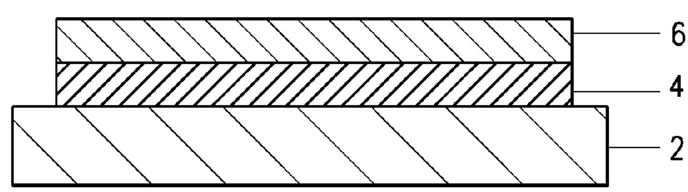
Figure 2D:
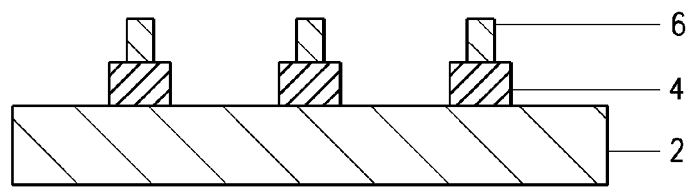
Figure 2E:
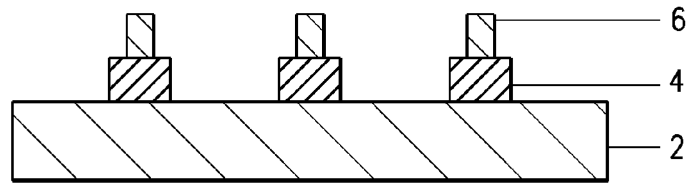

There is a need for improved FED processes. Currently reported FED manufacturing processes involves many steps to obtain fine conductor lines and CNT emitters, as shown in U.S. Pat. No. 7,276,844, which is incorporated herein by reference. In the process, conductor electrodes and emitters are formed by a separate imaging, development and firing steps.

The present invention is directed to a co-processing method of formation of FED cathode electrode and emitter. A further aspect of the invention relates to a co-processable photoimageable silver composition and a CNT composition for the processing method. The present invention, including the methods and compositions, result in improvements in the manufacture of FED devices, including a reduction in the number of manufacture steps.

The present invention relates to improved FED cathode electrode and emitter formation processes. The present invention further relates to processes including the co-processing of a photoimageable silver conductor composition and a CNT composition. Further, the present invention relates to compositions useful in the processes.

An embodiment of the invention relates to a method of forming cathode electrode and CNT emitters of FED. In an aspect of the embodiment, the electrode may be formed, and then emitters may be formed on the electrode. An aspect of the invention relates to the combination of photoimageable silver paste and CNT paste to make FED cathode electrode and emitters by a co-imaging, co-development and co-firing process. In an embodiment, an emitter pattern may be formed which differs from the silver electrode pattern. A further aspect relates to separate imaging, co-development and co-firing process which may be used to obtain different electrode and emitter patterns. A further embodiment of the invention relates to a silver composition, a CNT composition, and a combination of the silver composition and the CNT composition useful in the methods described herein.

FIG. 1 illustrates a sequence of steps in the method of making silver electrode and CNT emitters. In the first step, a photoimageable silver paste (4) was screen-printed on a substrate (2) and dried in air. In a further embodiment, the paste (4) may be coated on the substrate. In an embodiment, the substrate may be glass. In the second step, a photoimageable CNT paste (6) was screen-printed on top of the dry silver paste (4) and dried in air. In a further embodiment, the CNT paste may be coated on the substrate with silver paste. In the third step, UV light was exposed through a photo-mask onto the dried CNT/silver layers and developed by sodium carbonate aqueous solution. Other developing solutions, such as a mixture of NMP and water, will be recognized by one of skill in the art. In the last step, the developed substrate was fired. The firing may be conducted under an atmosphere of nitrogen or in air.

FIG. 2 illustrates a sequence of steps in the method of making silver electrode and CNT emitters with different patterns. In the first step, a photoimageable silver paste (4) was screen-printed on a substrate (2) and dried in air. Secondly, a $1^{st}$ photomask of the silver electrode pattern was then used to expose the silver layer (4) to UV radiation. In the third step, a photoimageable CNT paste (6) was screen-printed on top of the exposed substrate (2) and dried. In the fourth step, the substrate (2) was exposed to UV light through a $2^{nd}$ photomask and developed by sodium carbonate aqueous solution. In the last step, the developed substrate was fired. The firing may be conducted under an atmosphere of nitrogen or in air.

In an embodiment, the current firing temperature for CNT-emitter pastes may be less than about 500 degrees C. In an embodiment, resinates or organo-metallic materials may be added to the CNT compositions. In an embodiment, the CNT composition may include a photoinitiator system.

In an embodiment, the silver paste may include spherical silver particles. The silver particles may be coated with surfactants or uncoated. In an aspect, the silver particles may be crystalline. The shape of the silver particles is non-limiting; for example, the particles may be a little irregular, perfect spherical, or in between. In an embodiment, the silver particle size may be between 0.1 to 10 microns. In a further embodiment, the particle size may be between 0.5 to 5 microns.

The acicular carbon used herein may be of various types, such as carbon nanotubes or thin wall carbon nanotubes, for example. In an embodiment, the individual thin wall carbon nanotubes may have 2-4 walls, for example.

The substrate may be any material to which the paste composition will adhere. If the paste is non-conducting and a non-conducting substrate is used, a film of an electrical conductor to serve as the cathode electrode and provide means to apply a voltage to and supply electrons to the acicular carbon may be included. In an embodiment, silicon, a glass, a metal or a refractory material such as alumina may serve as the substrate. In an embodiment, the substrate in display applications may be glass; in a further aspect, the glass may be soda lime glass.

In an embodiment, the photopatterning emitter paste used for screen printing may include acicular carbon, a photoimageable organic medium which comprises a photoinitiator system, an aqueous developable binder polymer and photohardenable monomers, solvent, surfactant, and either low softening point glass frit, metallic powder or metallic paint or a mixture thereof. The paste may also contain a metal resinate or a mixtures of resinates.

The silver conductor paste and CNT emitter paste described herein may, for example, be prepared by three-roll milling a mixture of silver or acicular carbon, organic medium, surfactant, a solvent and either low softening point glass frit, metallic powder or metallic paint or a mixture thereof.

Several examples demonstrating the use of photoimagable carbon-nanotube pastes are described in U.S. Pat. No. 7,276,844, which is hereby incorporated herein by reference. Several examples of the use of photoimageable silver conductor pastes are described in U.S. Pat. No. 7,135,267, which is hereby incorporated herein by reference.

I. Carbon Nanotubes

Carbon nanotubes which give desired emission performance are contemplated. In an embodiment, they may be single wall, multi-walls, or 2 to 4 walls, for example.

II. Silver Particles

In an embodiment, the silver paste may include spherical silver particles. The silver particles may be coated with surfactants or uncoated. In an aspect, the silver particles may be crystalline. The shape of the silver particles is non-limiting; for example, the particles may be a little irregular, perfect spherical, or in between. In an embodiment, the silver particle size may be between 0.1 to 10 microns. In a further embodiment, the particle size may be between 0.5 to 5 microns. In an embodiment, the surface area/weight ratio of the conductive particles may be less than 20 $m^2/g$.

III. Organic Medium

In an embodiment, the organic medium may serve as a vehicle for dispersion of the finely divided solids of the composition. The dispersion may be in such form that it can readily be applied to a glass or other substrate. Organic medium useful in the present invention will be recognized by one of ordinary skill in the art. An exemplary medium composition is shown in Table 3. The main components of the medium follows:

A. Polymer

In an embodiment, the polymer may have aqueous developability and give a high resolving power. The polymers may be made of copolymer, interpolymer or mixtures thereof, wherein each copolymer or interpolymer comprises (1) a nonacidic comonomer comprising a C1-10 alkyl acrylate, C1-10 alkyl methacrylate, styrenes, substituted styrenes or combinations thereof and (2) an acidic comonomer comprising ethylenically unsaturated carboxylic acid containing moiety. Examples of the vinyl group include, but are not limited to methacrylate and acrylate groups. The copolymer, interpolymer or mixture thereof has an acid content of at least 10 wt. % of the total polymer weight; a glass transition temperature of 50-150° C. and an weight average molecular weight in the range of 2,000-250,000 and all ranges contained within.

In an embodiment, the acidic functional group of the acidic comonomer may provide the ability to be developed in aqueous bases such as aqueous solutions of 0.4-2.0% sodium carbonate. When acidic comonomers are present in concentrations of less than 10%, the composition may not be completely washed off with an aqueous base. When the acidic comonomers are present at concentrations greater than 30%, the composition, may be less resistant under development conditions and partial development occurs in the image portions. Contemplated acidic comonomers include ethylenically unsaturated monocarboxylic acids such as acrylic acid, methacrylic acid, or crotonic acid and ethylenically unsaturated dicarboxylic acids such as fumaric acid, itaconic acid, citraconic acid, vinyl succinic acid, and maleic acid, as well as their hemiesters, and in some cases their anhydrides and their mixtures. In an embodiment, methacrylic polymers may be used.

In an embodiment in which the nonacidic comonomers are alkyl acrylates or alkyl methacrylates as mentioned above, these nonacidic comonomers may be greater than about 50 wt. % of the polymer binder; in a further embodiment, the nonacidic comonomers may be 70-75 wt. %, of the polymer binder. In an embodiment in which the nonacidic comonomers are styrene or substituted sytrenes, these nonacidic comonomers may be about 50 wt. % of the polymer binder and the other about 50 wt. % may be an acid anhydride such as the hemiester of maleic anhydride. A exemplary, non-limiting substituted styrene is alpha-methylstyrene.

In an embodiment, the nonacidic portion of the polymer binder may include less than about 50 wt. % of other nonacidic comonomers as substitutes for the alkyl acrylate, alkyl methacrylate, styrene, or substituted styrene portions of the polymer. Examples include acrylonitrile, vinyl acetate, and acrylamide. In addition to the above copolymers, the addition of small amounts of other polymer binders is also contemplated. Non-limiting examples include polyolefins such as polyethylene, polypropylene, polybutylene, polyisobutylene, and ethylene-propylene copolymers, polyvinyl alcohol polymers (PVA), polyvinyl pyrrolidone polymers (PVP), vinyl alcohol and vinyl pyrrolidone copolymers, as well as polyethers that are low alkylene oxide polymers such as polyethylene oxide.

In an embodiment, the weight average molecular weight of the polymer binder is in the range of 2,000-250,000 and any ranges contained therein; in a further embodiment, 5000-10,000.

In an embodiment, the total polymer in the composition may be in the range of 5-70 wt. %, in a further embodiment, 20-40%, based on total composition and any ranges contained therein.

B. Photohardenable Monomer

Conventional photohardenable methacrylate monomers are optional additives to the compositions described herein. In an embodiment, monomer components may be present in amounts of 1-20 wt. %, based on the total weight of the dry photopolymerizable layer. Non-limiting, exemplary monomers include t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethyacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds disclosed in U.S. Pat. No. 3,380,831, hereby incorporated herein by reference, 2,2-di(p-hydroxy-phenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di-(p-hydroxyphenyl)propane dimethacrylate, di-(3-methacryloxy-2-hydroxypropyl)ether of bisphenol-A, di-(2-methacryloxyethyl) ether of bisphenol-A, di-(3-acryloxy-2-hydroxypropyl)ether of bisphenol-A, di-(2-acryloxyethyl) ether of bisphenol-A, di-(3-methacrloxy-2-hydroxypropyl) ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also contemplated are ethylenically unsaturated compounds having a weight average molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, here by incorporated herein by reerence, e.g., those having a plurality of free radical polymerizable ethylenic linkages particularly when present as terminal linkages. Non-limiting exemplary monomers include polyoxyethylated trimethylolpropane triacrylate, ethylated pentaerythritol triacrylate, dipentaerythritol monohydroxypentaacrylate and 1,10-decanediol dimethlacrylate.

C. Photoinitiation System

Suitable photoinitiation systems are those, which generate free radicals upon exposure to actinic light at ambient temperature. The combination of specific photoinitiator system components Irgacure 907 and DETX Speedcure are contemplated, and were shown to be advantageous over other components.

In an embodiment, the DETX may be 1 to 7 wt % of the CNT paste composition. In a further embodiment, the DETX may be 3 to 5 wt % of the CNT paste composition. In a further embodiment, the DETX may be 2.5 to 4.0 wt % of the CNT paste composition.

In an embodiment, the Irgacure 907 may be 2 to 14 wt % of the CNT paste composition. In a further embodiment, the Irgacure 907 may be 6 to 12 wt % of the CNT paste composition. In a further embodiment, the Irgacure 907 may be 8 to 10 wt % of the CNT paste composition.

In an embodiment, the ratio of Irgacure 907 to DETX may be equal to, or between, 1 to 6. In a further embodiment, the ratio of Irgacure 907 to DETX may be 2 to 4. In a further embodiment, the ratio of Irgacure 907 to DETX may be about 3.

The example monomers include the substituted or unsubstituted polynuclear quinones which are compounds having two intracyclic carbon atoms in a conjugated carbocyclic ring system, e.g., 2-benzyl-2-(dimethylamino)-1-(4-morpholinophenyl)-1-butanone, 2,2-dimethoxy-2-phenylacetophenone, 9,10-anthraquinone, 2-methylanthraquinone, 2-ethylanthraquinone, 2-tert-butylanthraquinone, octamethylanthraquinone, 1,4-naphthoquinone, 9,10-phenanthrenequinone, benz (a) anthracene-7,12-dione, 2,3-naphthacene-5,12-dione, 2-methyl-1,4-naphthoquinone, 2,4-diethyl-9H-thioxanthen-9-one, 1,4-dimethyl-anthraquinone, 2,3-dimethyl-anthraquinone, 2-phenylanthraquinone, 2,3-diphenylanthraquinone, retenequinone, 7,8,9,10-tetrahydronaphthracene-5,12-dione, 2-methyl-1-[-(methylthio)phenyl]-2-(4-morpholinyl)-1-propanone, and 1,2,3,4-tetrahydrobenz(a)anthracene-7,12-dione. Other photoinitiators which are also contemplated are described in U.S. Pat. No. 2,760,863, hereby incorporated herein by reference, and include vicinal ketaldonyl alcohols such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin, thioxanthone and/or thioxanthone derivatives and the appropriate hydrogen donors. Non-limiting, exemplary initiators include photoreducible dyes and reducing agents disclosed in U.S. Pat. Nos. 2,850,445, 2,875,047, 3,097,096, 3,074,974, 3,097,097, and 3,145,104, hereby incorporated herein by reference, as well as dyes of the phenazine, oxazine, and quinone classes, Michler's ketone, benzophenone, 2,4,5-triphenylimidazolyl dimers with hydrogen donors including leuco dyes and mixtures thereof as described in U.S. Pat. Nos. 3,427,161, 3,479,185, and 3,549,367, hereby incorporated herein by reference. Also contemplated for use with photoinitiators and photoinhibitors are sensitizers disclosed in U.S. Pat. No. 4,162,162, hereby incorporated herein by reference. The photoinitiator or photoinitiator system is present in 0.05 to 10% by weight based on the total weight of a dry photopolymerizable layer.

D. Solvents

In an embodiment, the solvent component of the organic medium, which may be a mixture of solvents, may be selected by one or ordinary skill in the art to achieve solution therein of the polymer and other organic components. The solvent may be inert (non-reactive) towards the other constituents of the composition. For screen printable and photoimageable pastes, the solvent(s) may have sufficiently high volatility to enable the solvent to be evaporated from the dispersion by the application of relatively low levels of heat at atmospheric pressure. In an embodiment, the solvent may not be so volatile that the paste rapidly dries on a screen, at normal room temperatures, during the printing process. In an embodiment, the solvents for use in the paste compositions may have boiling points at atmospheric pressure of less than 300° C., and, in a further embodiment, less than 250° C. Non-limiting, exemplary solvents include aliphatic alcohols, esters of such alcohols, for example, acetates and propionates; terpenes such as pine oil and alpha- or beta-terpineol, or mixtures thereof; ethylene glycol and esters thereof, such as ethylene glycol monobutyl ether and butyl cellosolve acetate; carbitol esters, such as butyl carbitol, butyl carbitol acetate and carbitol acetate and other appropriate solvents such as Texanol® (2,2,4-trimethyl-1,3-pentanediol monoisobutyrate). For casting tapes, the solvent(s) may have lower boiling points than solvents used for screen printable pastes. Such solvents include ethylacetate, methanol, isoproanol, acetone, xylene, ethanol, methylethyl ketone and toluene.

E. Other Additives

In an embodiment, the organic medium may also include one or more plasticizers. Among the plasticizers which have been used in various binder systems are diethyl phthalate, dibutyl phthalate, butyl benzyl phthalate, dibenzyl phthalate, alkyl phosphates, polyalkylene glycols, glycerol, poly (ethylene oxides), hydroxy ethylated alkyl phenol, tricresyl phosphate triethyleneglycol diacetate and polyester plasticizers. Additional components known in the art may be present in the composition including dispersants, stabilizers, release agents, dispersing agents, stripping agents, antifoaming agents and wetting agents. A general disclosure of exemplary, non-limiting materials is presented in U.S. Pat. No. 5,049,480, which is hereby incorporated herein by reference.

The composition of the present invention may be processed by using a firing profile known to those skilled in the art of thick film technology. Removal of the organic medium and sintering of the inorganic materials may be dependent on the firing profile.

IV. Methods

An embodiment relates to a method of manufacturing an electrode and an emitter in a field emission device, including the steps of: (a) printing a photoimageable conductive composition on a substrate, (b) printing a photoimageable CNT composition on the conductive composition, (c) exposing the printed substrate to UV light, (d) developing the exposed substrate, and (e) firing the developed substrate.

A further embodiment relates to a method of manufacturing an electrode and an emitter in a field emission device, comprising the steps of:

(a) printing a photoimageable conductive composition on a substrate, (b) exposing the printed substrate to UV light, (c) printing a photoimageable CNT composition on the conductive composition, (d) exposing the printed substrate to UV light, (e) developing the exposed substrate, and (f) firing the developed substrate.

Non-limiting embodiments of the method are described as follows: The silver conductor composition or paste described in this invention can be applied on to a substrate either by screen printing or coating methods. In an aspect, the composition or paste may be applied to a large area substrate. The substrate may be sufficiently large as to be used to make panels for four 40" Televisions. The composition or paste may be applied by screen printing or other coating methods. The silver conductor paste may then be dried on the substrate using standard drying conditions. Optionally, in an embodiment, a photomask may be applied to the silver conductor paste, and the paste may be exposed to UV at this stage of method.

The CNT paste composition may then be applied on top of the dried silver conductor paste. The composition or paste may be applied by screen printing or other coating methods. The CNT paste may then be dried on the substrate using standard drying conditions. After drying, a photomask with desired patterns may be placed on top of the dried CNT composition layer. In an embodiment, the photomask may be applied directly on the CNT surface. In a further embodiment, a gap of air may be present between the photomask and the CNT surface.

The CNT and silver composition layers may then be exposed to UV-light which passes through the open portions of the photomask. Upon exposure, the exposed composition layers harden and form patterns which are revealed after the development stage.

In an embodiment, the UV-exposure energy may be greater than 75 mJ/cm2. In an embodiment, the UV-exposure energy may be 75-500 mJ/cm2. In a further embodiment, the UV-exposure energy may be 75-300 mJ/cm2. In a further embodiment, the UV-exposure energy may be 100-200 mJ/cm2. Without sufficient UV exposure energy, the exposed areas are removed during the development step. With excessive UV-exposure energy, sufficient line resolution was not obtained.

In the next stage, the layers may then be developed in a solution. In an embodiment, the solution may be basic; in an aspect of this embodiment, the solution may be aqueous or solvent-based. In a further aspect, the solution may be a sodium carbonate aqueous developer solution. The non-exposed portions are removed during development, and the exposed portions remain. The exposed portions remain in the desired patterns that result from the choice of photomask and pattern of exposure.

The conductor/emitters on the substrate are then firing stage. The firing may be carried out in air or nitrogen. In an embodiment, the firing may be between 350° C. and 550° C. In a further embodiment, the firing may be between 400° C. and 500° C. In a further embodiment, the firing may be between 420° C. and 480° C. In an aspect of the embodiment in which the firing is carried out in nitrogen, the firing may be greater than 550° C.

EXAMPLES

Sample Preparation and Processing

The photoimagable conductive paste and emitter paste were prepared by three roll-milling the silver or carbon nanotube powder and organic medium together, respectively. The pastes were screen printed by using a 325-400 mesh stainless steel screen on to a substrate. Other well-known screen printing techniques are contemplated. The screen printed paste was then photopatterned via a photomask to form a latent image. The patterned paste was then developed by sodium carbonate aqueous solution or an organic solvent or solvent mixture, such as N-methyl-2-pyrrolidinone or NMP and water mixture for desired conductor/emitter or paste patterns. The conductor/emitters were then fired at a temperature of about 350° C. to about 490° C.

Example 1

The silver paste was printed on a 2"×3" glass substrate, whose composition is shown in Table 1, and dried at 80° C. for 40 minutes, resulting in 6.2 microns thickness. CNT paste I, whose composition is shown in Table 2, was printed on top of the above dry silver paste and dried at 80° C. for 20 minutes, resulting in total thickness of the combined silver and CNT layers of 11.8 microns. The printed substrate was exposed at 400 mJ/cm$^2$ via a standard Fodel test photomask and developed by 0.5 wt % sodium carbonate aqueous solution for 27 seconds, resulting in 20 microns wide lines, i.e. line and space resolution of 20 microns.

Example 2

The silver paste was printed on a 2"×3" glass substrate, whose composition is shown in Table 1, and dried at 80° C. for 40 minutes, resulting in 6.4 microns thickness. CNT paste II, whose composition is shown in Table 2, was printed on top of the above dry silver paste and dried at 80° C. for 20 minutes, resulting in total thickness of the combined silver and CNT layers of 12.0 microns. The printed substrate was exposed at 400 mJ/cm$^2$ via a standard Fodel test photomask and developed by 0.5 wt % sodium carbonate aqueous solution for 44 seconds, resulting in 70 microns wide lines, i.e. line and space resolution of 70 microns.

Example 3

Figure 3:
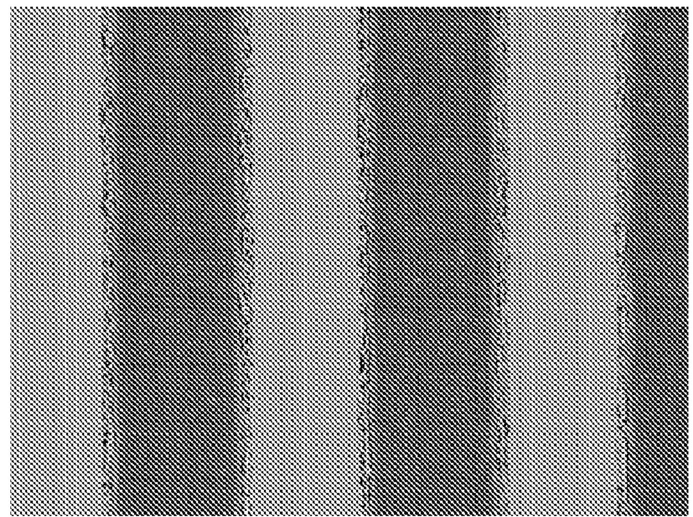
FIG. 3 is an optical micrograph of the silver/CNT bi-layer after $N_2$ firing disclosed in Example 3.

A 3 cm×3 cm patch of photoimagable Ag paste, whose composition is shown in Table 5, was printed with 325 mesh screen on a 2"×2" soda lime glass and dried at 80° C. for 30 minutes, resulting in 7.0 microns thickness. A 2.4 cm×2.4 cm patch of photoimagable CNT paste II, whose composition is shown in Table 1, was printed and centered on top of the above dry silver paste and dried at 80° C. for 15 minutes, resulting in total thickness of the combined silver and CNT layers of 13.0 microns. A photomask was applied in contact with the CNT layer. The printed substrate was exposed to UV radiation at 120 mJ/cm$^2$ via a photomask of 200/100 micron line/space. The exposed substrate was then developed by 0.5 wt % sodium carbonate aqueous solution spray for 45 seconds, resulting in 200 microns wide lines of CNT/silver bi-layer. The developed substrate was air burned out at 400° C. for 20 minutes in a box furnace and fired in a belt furnace with a $N_2$ atmosphere to 515° C. for 20 minutes at peak temperature. FIG. 3 shows an optical micrograph of the CNT/silver bi-layer after $N_2$ firing.

Figure 4:
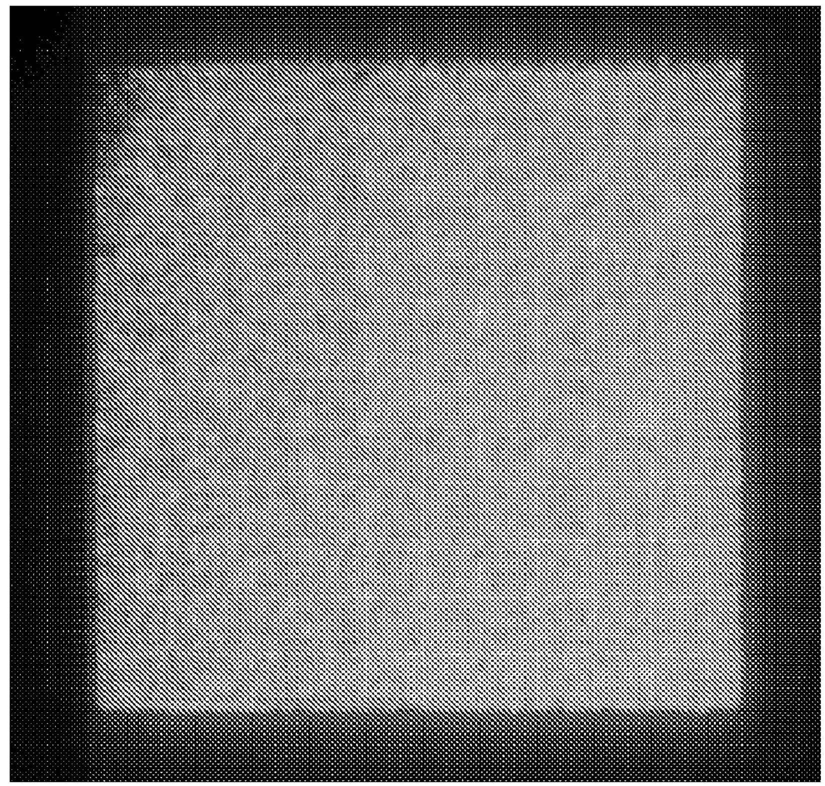
FIG. 4 is an image of phosphor illumination by electrons emitted by the co-processed CNT/silver bi-layer disclosed in Example 3.

A piece of adhesive tape was then laminated over the fired CNT/silver bi-layer and subsequently removed. This process, commonly referred to as "activation", "tape activation", or "tape activated" is known to fracture the film surface exposing and lifting the CNT filaments off the substrate surface to dramatically enhance electron field emission. This activation process was disclosed in details in US patent application publication number 2002/0074932, which is hereby incorporated by reference herein. A diode field emission device was then assembled by using the fired and activated part as a cathode. Opposite to this cathode, an anode plate consisting of an ITO coated glass substrate with a phosphor coating was mounted. Electrically insulating spacers 1 mm thick were used to maintain a distance between the cathode and anode substrates. Electrical contact was made to the cathode and anode electrodes using silver paint and copper tape to complete the diode device. The device was mounted in a vacuum chamber which was evacuated to a pressure of $<1\times10^{-5}$ Torr. A pulsed square wave with a repetition rate of 60 Hz and a pulse width of 60 μs was applied to the anode electrode. The cathode electrode was maintained at ground potential. At an anode voltage of 2.5 kV, an anode current of 200 μA was obtained. An image of phosphor illumination by electrons emitted by this device is shown in FIG. 4.

Example 4

A 3 cm×3 cm patch of photoimagable Ag paste, whose composition is shown in Table 5, was printed with 325 mesh screen on a 2"×2" soda lime glass and dried at 80° C. for 30 minutes, resulting in 7.0 microns thickness. A 2.4 cm×2.4 cm patch of photoimagable CNT paste III, whose composition is shown in Table 6, was printed and centered on top of the above dry silver paste and dried at 80° C. for 15 minutes, resulting in total thickness of the combined silver and CNT layers of 13.0 microns. A photomask was applied in contact with the CNT layer. The printed substrate was exposed to UV radiation at 200 mJ/cm$^2$ via a photomask of 200/100 micron line/space. The exposed substrate was then developed by 0.5 wt % sodium carbonate aqueous solution spray for 45 seconds, resulting in 200 microns wide lines of CNT/silver bi-layer. The developed substrate was fired in a belt furnace with an air atmosphere to 490° C. for 20 minutes at peak temperature. The fired substrate was tape activated as described in Example 3 and used as the cathode of a diode field emission device. This co-imaged, co-developed, and air co-fired part yielded an emission current of 150 μA at 2.5 kV pulsed anode voltage when tested under the same conditions used in Example 3.

Example 5

A 3 cm×3 cm patch of photoimagable Ag paste, whose composition is shown in Table 5, was printed with 325 mesh screen on a 2"×2" soda lime glass and dried at 80° C. for 30 minutes, resulting in 7.0 microns thickness. A photomask was applied in contact with the silver layer. The dried silver layer was first exposed to UV radiation at 200 mJ/cm$^2$ via a photomask of 200/100 micron line/space. A 2.4 cm×2.4 cm patch of photoimagable CNT paste III, whose composition is shown in Table 6, was printed and centered on top of the above dried and exposed silver paste and dried at 80° C. for 15 minutes, resulting in total thickness of the combined silver and CNT layers of 13.0 microns. A photomask was applied in contact with the CNT layer. The printed substrate was again exposed to UV radiation at 200 mJ/cm$^2$ via a second photomask of dash line pattern consisting of 150×750 μm dashes.

Figure 5:
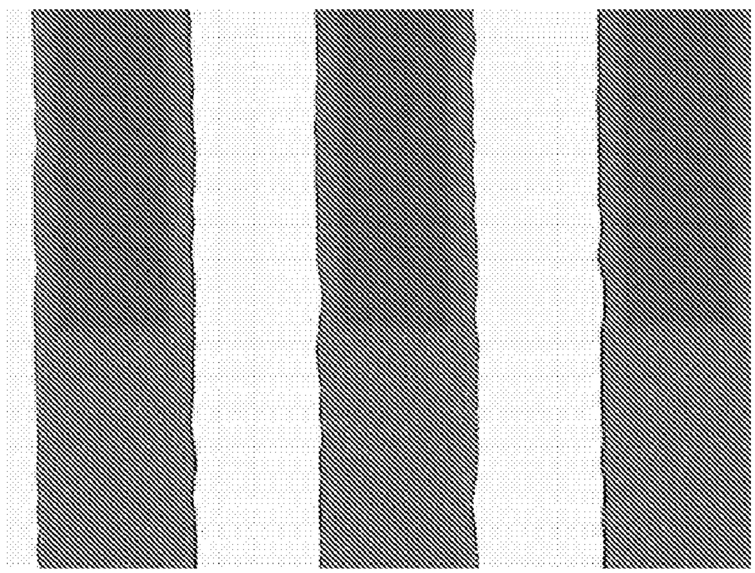
FIG. 5 is an optical micrograph of the CNT dashes over silver line after air firing as disclosed in Example 5.
Figure 6:
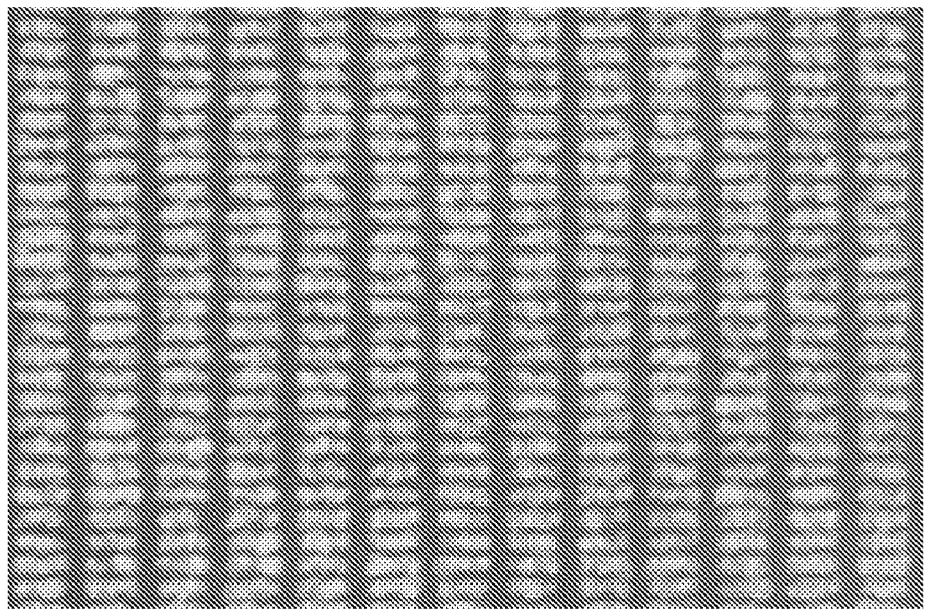
FIG. 6 is an image of phosphor illumination by electrons emitted by the separate-image, co-develop, and air co-fire field emission cathode part disclosed in Example 5.

The exposed substrate was then developed by 0.5 wt % sodium carbonate aqueous solution spray for 45 seconds, resulting in 150×750 μm dashes of CNT emitter over 200 microns wide silver lines. FIG. 5 shows an optical micrograph of the CNT dashes over silver line after air firing. The developed substrate was fired in a belt furnace with an air atmosphere to 490° C. for 20 minutes at peak temperature. The fired substrate was tape activated and used as the cathode of a diode field emission device. This separate-imaged, co-developed, and air co-fired part yielded an emission current of 50 μA at 2.5 kV pulsed anode voltage when tested under the same conditions used in example 3. FIG. 6 shows an image of phosphor illumination by electrons emitted by the separate-imaged, co-developed, and air co-fired field emission cathode part disclosed in Example 5.

Comparative Example 1

The silver paste was printed on a 2"×3" glass substrate, whose composition is shown in Table 1, and dried at 80° C. for 40 minutes, resulting in 6.4 microns thickness. CNT paste II, whose composition is shown in Table 2, was printed on top of the above dry silver paste and dried at 80° C. for 20 minutes, resulting in total thickness of the combined silver and CNT layers of 12.0 microns. The printed substrate was exposed at 50 mJ/cm$^2$ via a standard Fodel test photomask and developed by 0.5 wt % sodium carbonate aqueous solution for 44 seconds. The exposed portions did not harden and were completely removed during development.

Comparative Example 2

The silver paste was printed on a 2"×3" glass substrate, whose composition is shown in Table 1, and dried at 80° C. for 40 minutes, resulting in 6.4 microns thickness. CNT paste II, whose composition is shown in Table 2, was printed on top of the above dry silver paste and dried at 80° C. for 20 minutes, resulting in total thickness of the combined silver and CNT layers of 12.0 microns. The printed substrate was exposed at 800 mJ/cm$^2$ via a standard Fodel test photomask and developed by 0.5 wt % sodium carbonate aqueous solution for 44 seconds. Sufficient line resolution was not obtained. The gaps between the developed lines were too narrow, and some of the lines peeled.

Glossary of Materials for Examples

TABLE 1

| Silver Composiiton | |
|---|---|
| Solvent I | 2.97 wt % |
| Malnolic acid | 0.51 |
| Surfactant | 0.1 |
| Monomer III | 1.25 |
| Monomer II | 3.99 |
| Organic Medium B | 19.8 |
| Glass Frit | 2.94 |
| Silver Powder | 68.8 |

TABLE 2

| CNT Paste Compositions | | |
|---|---|---|
| | CNT Paste I | CNT Paste II |
| Organic Medium A | 73.09 | 73.09 |
| Alumina | 10.72 | 9.28 |
| Monomer I | 6.93 | 6.93 |
| Monomer II | 6.93 | 6.93 |
| CNT | 1.44 | 2.88 |

TABLE 3

| Medium A Composition | |
|---|---|
| Solvent I | 47.69 |
| Polymer A | 1.46 |
| Polymer B | 34.00 |
| Photoinitiator II | 3.9 |
| TAOBN | 0.06 |
| Photoinitiator I | 11.7 |
| Malnolic acid | 1.19 |

TABLE 4

| Medium B Composition | |
|---|---|
| Polymer A | 36.01 wt % |
| Solvent I | 52.48 |
| Photoinitiator III | 5.72 |
| Photoinitiator IV | 5.72 |
| TAOBN | 0.07 |

TABLE 5

| Silver Composiiton | |
|---|---|
| Solvent II | 2.57 wt % |
| Malnolic acid | 0.96 |
| Surfactant | 0.1 |
| Monomer III | 1.25 |
| Monomer II | 3.99 |
| Organic Medium B | 21.18 |
| Glass Frit | 15.19 |
| Silver Powder | 54.76 |

TABLE 6

| CNT Paste Compositions | |
|---|---|
| | CNT Paste III |
| Organic Medium A | 74.00 |
| Alumina | 11.42 |
| Monomer I | 6.93 |
| Monomer II | 6.93 |
| CNT (mostly thin wall CNT) | 0.72 |

Solvent I: alpha-Terpineol, purchased from DRT, France.

Solver II: Texanol®, purchased from Eastman Chemicals.

Polymer A: A copolymer of 80%, by weight, methyl methacrylate and 20% methacrylic acid, weight average molecular weight Mw=~7,000, acid number=~125, purchased from Noveon.

Polymer B: Copolymer of vinylpyrrolidone and vinyl acetate, S630 from ISP.

Photoinitiator I: Irgacure 907, 2-methyl-1-[-(methylthio)phenyl]-2-(4-morpholinyl)-1-propanone, purchased from Ciba Specialty Chemicals.

Photoinitiator II: DETX, 2,4-diethyl-9H-thioxanthen-9-one, DETX speedcure from Aceto Corporation.

Photoinitiator III: Irgacure 651 purchased from Ciba Specialty Chemicals.

Photoinitiator IV: Irgacure 369 purchased from Ciba Specialty Chemicals.

TAOBN: 1,4,4-trimethyl-2,3-diazabicyclo [3,2,2]-non-2-ene-N,N'-dioxide by DuPont.

Carbon Nanotubes (CNT): Thin Wall Carbon Nanotubes, purchased from CNI.

Alumina: Alumina AKP-20 (D50=0.5 microns), purchased from Sumitomo Chemicals.

Monomer I: SB510E35, acrylate monomer/oligomer blend, purchased from Sartomer.

Monomer II: SR-454D, Trimethylolpropane ethoxy triacrylate, purchased from Sartomer.

Monomer III: LR8967, purchased from BASF.

Malnonic acid: purchased from Aldrich Chemicals.

Surfactant: Poly(alphamethyl siloxanes), purchased from BYK-Chemie.

Silver powder: Ferro 7000-7, purchased from Ferro.

Glass frit: BT26025, purchased from Yamamoru Glass.

What is claimed is:

1. A method of manufacturing an electrode and an emitter in a field emission device, comprising the steps of:

(a) printing a photoimageable conductive composition on a substrate, (b) printing a photoimageable carbon nanotube (CNT) composition on the conductive composition, wherein the photoimageable CNT composition comprises CNT, acrylate monomer/oligomer blend, Trimethylolpropane ethoxy triacrylate, 2-methyl-1-[-(methylthio)phenyl]-2-(4-morpholinyl)-1-propanone and 2,4-diethyl-9H-thioxanthen-9-one, (c) exposing the printed substrate to UV light, (d) developing the exposed substrate, and (e) firing the developed substrate.

2. The method of claim 1, wherein the 2,4-diethyl-9H-thioxanthen-9-one is 1 to 7 wt % of the CNT paste, the 2-methyl-1-[-(methylthio)phenyl]-2-(4-morpholinyl)-1-propanone is 2 to 14 wt % of the CNT paste.

3. The method of claim 2, wherein the ratio of 2-methyl-1-[-(methylthio)phenyl]-2-(4-morpholinyl)-1-propanone to 2,4-diethyl-9H-thioxanthen-9-one is 2, 4, or between 2 and 4.

4. An electrode and an emitter in a field emission device made by the method of claim 1.

5. A flat panel display comprising the field emission device of claim 4.

6. A photoimageable CNT composition comprising CNT, acrylate monomer/oligomer blend, Trimethylolpropane ethoxy triacrylate, 2,4-diethyl-9H-thioxanthen-9-one, and 2-methyl-1-[-(methylthio)phenyl]-2-(4-morpholinyl)-1-propanone, wherein the 2,4-diethyl-9H-thioxanthen-9-one is 1 to 7 wt % of the CNT paste, the 2-methyl-1-[-(methylthio)phenyl]-2-(4-morpholinyl)-1-propanone is 2 to 14 wt % of the CNT paste.

7. The composition of claim 6, wherein the ratio of 2-methyl-1-[-(methylthio)phenyl]-2-(4-morpholinyl)-1-propanone to 2,4-diethyl-9H-thioxanthen-9-one is 2, 4, or between 2 and 4.

8. The composition of claim 6, wherein the CNT is 0.01 wt % to about 2 wt % of the total weight of solids in the paste.

9. The composition of claim 6, wherein the composition further comprises metal resinates.

10. The composition of claim 9, wherein the metal resinates are 1.5 to 4 wt % of the total weight of the solids in the paste.

11. A method of manufacturing an electrode and an emitter in a field emission device, comprising the steps of:

(a) printing a photoimageable conductive composition on a substrate, (b) exposing the printed substrate to UV light, (c) printing a photoimageable CNT composition on the conductive composition, wherein the photoimageable CNT composition comprises CNT, acrylate monomer/oligomer blend, Trimethylolpropane ethoxy triacrylate, 2-methyl-1-[-(methylthio)phenyl-]-2-(4-morpholinyl)-1-propanone and 2,4-diethyl-9H-thioxanthen-9-one, (d) exposing the printed substrate to UV light, (e) developing the exposed substrate, and (f) firing the developed substrate.

12. An electrode and an emitter in a field emission device made by the method of claim 11.

13. A flat panel display comprising the field emission device of claim 12.

* * * * *

UNITED STATES PATENT AND TRADEMARK OFFICE

CERTIFICATE OF CORRECTION

PATENT NO. : 8,002,603 B2
APPLICATION NO. : 12/468093
DATED : August 23, 2011
INVENTOR(S) : Haixin Yang et al.

It is certified that error appears in the above-identified patent and that said Letters Patent is hereby corrected as shown below:

Title Page, Item (54) Title and Col. 1, Line 2,

Correct Title: CO-PROCESSABLE PHOTOIMAGEABLE SILVER AND CARBON NANOTUBE COMPOSITIONS AND METHOD FOR FIELD EMISSION DEVISES Col. 11, Table 1: Malnolic acid should read Malonic acid Col. 12, Table 3: Malnolic acid should read Malonic acid Col. 12, Table 5: Malnolic acid should read Malonic acid Column 13, Line 16: Malnolic acid: should read Malonic acid Column 13, Line 20: Yamamoru Glass should read Yamamura Glass Signed and Sealed this
Twentieth Day of March, 2012

David J. Kappos
*Director of the United States Patent and Trademark Office*